United States Patent
Long et al.

(10) Patent No.: US 12,356,592 B2
(45) Date of Patent: Jul. 8, 2025

(54) AIRFLOW MANAGEMENT SYSTEM FOR POWER MODULE

(71) Applicant: SCHNEIDER ELECTRIC IT CORPORATION, Foxboro, MA (US)

(72) Inventors: Rong Long, St. Louis, MO (US); Joseph H. Bergesch, Chesterfield, MO (US); Lianne M. McMahan, Atkinson, NH (US)

(73) Assignee: SCHNEIDER ELECTRIC IT CORPORATION, Foxboro, MA (US)

( * ) Notice: Subject to any disclaimer, the term of this patent is extended or adjusted under 35 U.S.C. 154(b) by 454 days.

(21) Appl. No.: 17/746,584

(22) Filed: May 17, 2022

(65) Prior Publication Data

US 2023/0380112 A1    Nov. 23, 2023

(51) Int. Cl.
*H05K 7/20* (2006.01)
(52) U.S. Cl.
CPC ..... *H05K 7/20745* (2013.01); *H05K 7/20836* (2013.01)
(58) Field of Classification Search
CPC ............... H05K 7/1497; H05K 7/2059; H05K 7/20745; H05K 7/20836
See application file for complete search history.

(56) References Cited

U.S. PATENT DOCUMENTS

| | | | |
|---|---|---|---|
| 8,031,468 B2 | 10/2011 | Bean, Jr. et al. | |
| 8,184,435 B2 | 5/2012 | Bean, Jr. et al. | |
| 8,425,287 B2 | 4/2013 | Wexler | |
| 10,004,164 B2 | 6/2018 | Leigh et al. | |
| 2009/0241578 A1* | 10/2009 | Carlson | H05K 7/20745 361/690 |
| 2010/0248609 A1* | 9/2010 | Tresh | H05K 7/20745 165/104.34 |
| 2013/0269385 A1* | 10/2013 | Takahashi | H05K 7/20745 165/104.14 |
| 2023/0345678 A1* | 10/2023 | Osborn | H05K 7/20745 |

* cited by examiner

*Primary Examiner* — Jorge A Pereiro
*Assistant Examiner* — Michael James Giordano
(74) *Attorney, Agent, or Firm* — Lando & Anastasi, LLP

(57) ABSTRACT

A hot air containment system includes a service access partition assembly having a first opening, a second opening, and a third opening. The first opening is configured to provide access to an access space. The second opening is configured to provide access to cooling equipment and to receive a blanking panel. The third opening is configured to pass hot air from heat-generating equipment.

12 Claims, 11 Drawing Sheets

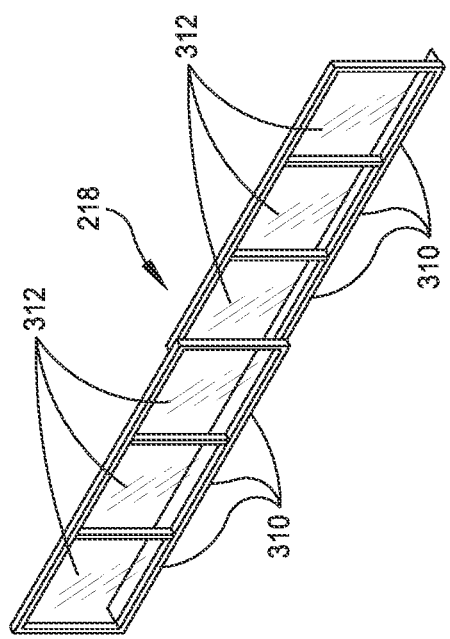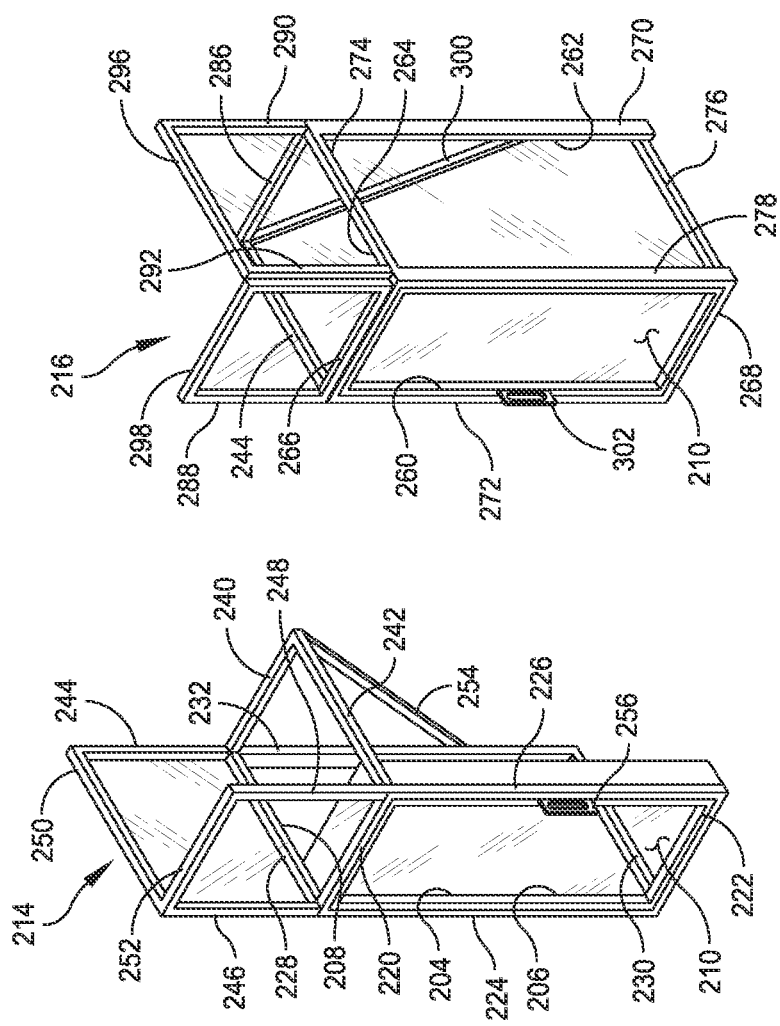

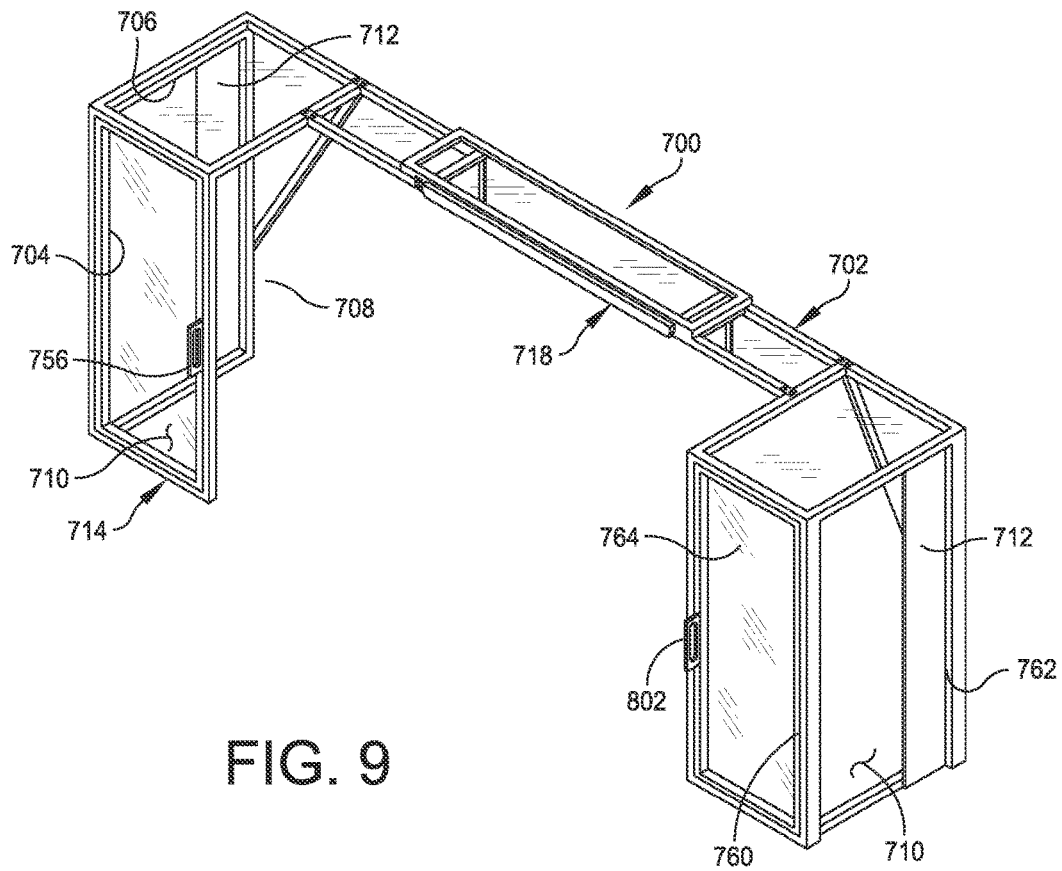
FIG. 9
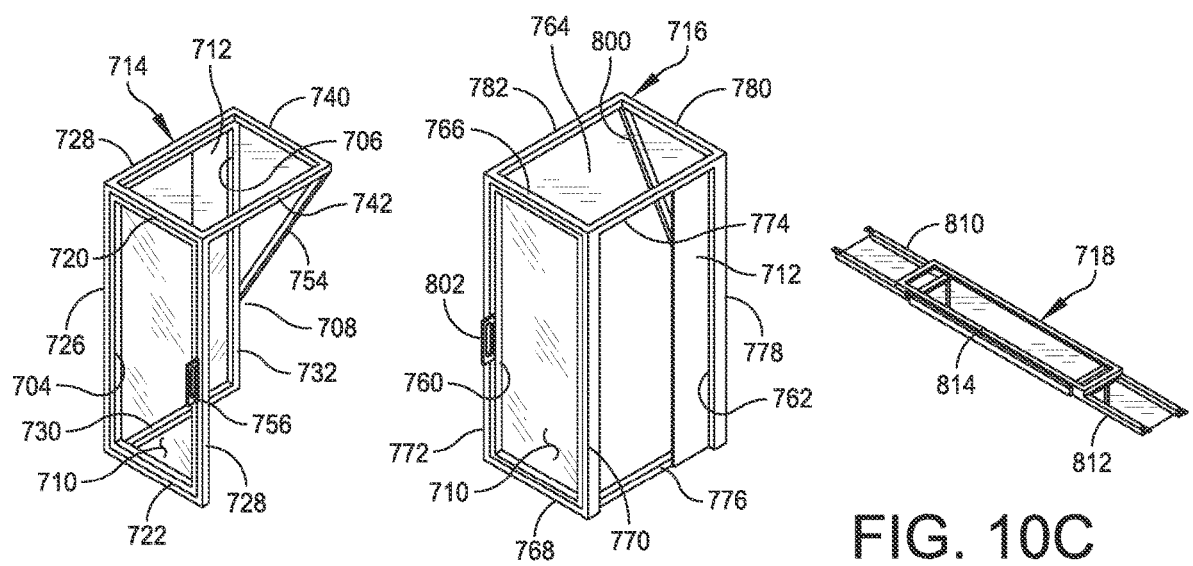
FIG. 10A
FIG. 10B
FIG. 10C

AIRFLOW MANAGEMENT SYSTEM FOR POWER MODULE

BACKGROUND OF DISCLOSURE

1. Field of Disclosure

The present disclosure is directed to an airflow management system for electronic equipment contained within a space, and more particularly to an airflow management system for electronic equipment contained within a prefabricated power module.

2. Discussion of Related Art

Equipment enclosures or racks for housing electronic equipment, such as data processing, networking and telecommunications equipment have been used for many years. Such racks are often used to contain and to arrange the equipment in large equipment rooms and data centers. However, as discussed below, the racks are also used in many applications, including relatively smaller data rooms and power modules. In certain embodiments, an equipment storage rack can be an open configuration and can be housed within a rack enclosure, although the enclosure may be included when referring to a rack.

Management systems have been developed to manage the power distribution and cooling systems of data centers containing racks. Specifically, heat produced by rack-mounted equipment can have adverse effects on the performance, reliability and useful life of the equipment components. In particular, rack-mounted equipment, housed within an enclosure, may be vulnerable to heat build-up and hot spots produced within the confines of the enclosure during operation. The amount of heat generated by a rack of equipment is dependent on the amount of electrical power drawn by equipment in the rack during operation. In addition, users of electronic equipment may add, remove, and rearrange rack-mounted components as their needs change and new needs develop.

Such rack-mounted equipment can be cooled by employing in-row cooling equipment. In some embodiments, dedicated in-row cooling units are placed between equipment racks to cool the electronic equipment housed within the equipment racks. However, in certain applications, using in-row cooling can be difficult. For example, within prefabricated power modules, since space is limited, it can be difficult to use in-row cooling equipment.

SUMMARY OF DISCLOSURE

One aspect of the present disclosure is directed to a hot air containment system comprising a service access partition assembly including a first opening, a second opening, and a third opening. The first opening is configured to provide access to an access space, the second opening is configured to provide access to cooling equipment and to receive a blanking panel, and the third opening is configured to pass hot air from heat-generating equipment.

Embodiments of the hot air containment system further may include configuring the third opening of the service access partition assembly to allow hot air to pass from top air exhaust heat-generating equipment. The third opening of the service access partition assembly may be configured to allow hot air to pass from rear air exhaust heat-generating equipment. The service access partition assembly may include a frame assembly defining the first opening, the second opening, and the third opening. The frame assembly may include a first frame subassembly provided at one end of the heat-generating equipment, the first frame sub-assembly having the first opening, the second opening and the third opening. The frame assembly further may include a second frame subassembly provided at an opposite end of the heat-generating equipment from the first frame subassembly, the second frame subassembly including a fourth opening, a fifth opening, and a sixth opening. The fourth opening may be configured to provide access to another access space, the fifth opening may be configured to provide access to cooling equipment and to receive a blanking panel, and the sixth opening may be configured to pass hot air from the heat-generating equipment. The frame assembly further may include a third frame subassembly configured to connect the first frame subassembly to the second frame subassembly. The third frame subassembly can be sized to accommodate a desired number of heat-generating equipment. The cooling equipment may include at least one in-row cooling unit. The first opening of the first frame subassembly may include an access door or removable panel.

Another aspect of the present disclosure is directed to a method of assembling an air containment system. In one embodiment, the method comprises: providing a service access partition assembly including a first opening, a second opening, and a third opening, the first opening being configured to provide access to an access space, the second opening being configured to provide access to cooling equipment and to receive a blanking panel, and the third opening being configured to pass hot air from heat-generating equipment; positioning the first opening adjacent an access space; positioning the second opening adjacent cooling equipment; optionally securing a blanking panel to the service access partition assembly to block a portion of the second opening; and positioning the third opening to enable hot air to pass from a row of inline heat generating equipment.

Embodiments of the method further may include configuring the third opening of the service access partition assembly to allow hot air to pass from top air exhaust heat-generating equipment. The third opening of the service access partition assembly may be configured to allow hot air to pass from rear air exhaust heat-generating equipment. The service access partition assembly may include a frame assembly defining the first opening, the second opening, and the third opening. The frame assembly may include a first frame subassembly provided at one end of the heat-generating equipment, the first frame subassembly having the first opening, the second opening and the third opening. The frame assembly further may include a second frame subassembly provided at an opposite end of the heat-generating equipment, the second frame subassembly including a fourth opening, a fifth opening, and a sixth opening. The fourth opening may be configured to provide access to another access space, the fifth opening is configured to provide access to cooling equipment and to receive a blanking panel, and the sixth opening is configured to pass hot air from the heat-generating equipment, the method further comprising positioning the fourth opening assembly adjacent the another access space, positioning the fifth opening adjacent cooling equipment, optionally securing a blanking panel to the service access partition assembly to block a portion of the fifth opening, and positioning the sixth opening to enable hot air to pass from the row of inline heat generating equipment. The frame assembly further may include a third frame subassembly configured to connect the first frame subassembly to the second frame subassembly, the method further comprising securing the third frame subassembly at one end thereof to the first frame subassembly, and securing the third frame subassembly at an opposite end thereof to the second frame subassembly. The third frame subassembly can be sized to accommodate a desired number of heat-generating equipment. The cooling equipment may include at least one in-row cooling unit.

Yet another aspect of the present disclosure is directed to a hot air containment system comprising a first frame subassembly including a first opening, a second opening, and a third opening. The first opening is configured to provide access to an access space, the second opening being configured to provide access to cooling equipment and to receive a blanking panel, and the third opening being configured to pass hot air from heat-generating equipment. The hot air containment system further comprises a second frame subassembly including a fourth opening, a fifth opening, and a sixth opening. The fourth opening is configured to provide access to another access space, the fifth opening is configured to provide access to cooling equipment and to receive a blanking panel, and the sixth opening is configured to pass hot air from the heat-generating equipment. The hot air containment system further comprises a third frame subassembly configured to connect the first frame subassembly and the second frame subassembly.

Embodiments of the hot air containment system further may include configuring the third opening of the first frame subassembly and the sixth opening of the second frame subassembly to allow hot air to pass from top air exhaust heat-generating equipment. The third opening of the first frame subassembly and the sixth opening of the second frame subassembly may be configured to allow hot air to pass from rear air exhaust heat-generating equipment. The third frame subassembly may be sized to accommodate a desired number of heat-generating equipment. The second opening of the first frame subassembly and the fifth opening of the second frame subassembly may be configured to receive cooling equipment. The cooling equipment may include at least one in-row cooling unit. The first opening of the first frame subassembly and the fourth opening of the second frame subassembly each may include an access door or removable panel.

BRIEF DESCRIPTION OF DRAWINGS

Various aspects of at least one example are discussed below with reference to the accompanying figures, which are not intended to be drawn to scale. The figures are included to provide illustration and a further understanding of the various aspects and examples, and are incorporated in and constitute a part of this specification, but are not intended as a definition of the limits of the disclosure. In the figures, identical or nearly identical components illustrated in various figures may be represented by like numerals. For purposes of clarity, not every component may be labeled in every figure. In the drawings:

FIGS. 5A-5C are perspective views of subsections of the airflow management system shown in FIG. 4;

FIG. 9 is a perspective view of an airflow management system having rear air exhaust of an embodiment of the present disclosure with equipment racks and cooling units removed for clarity;

FIGS. 10A-10C are perspective views of subsections of the airflow management system shown in FIG. 9.

DETAILED DESCRIPTION

Figure 1:
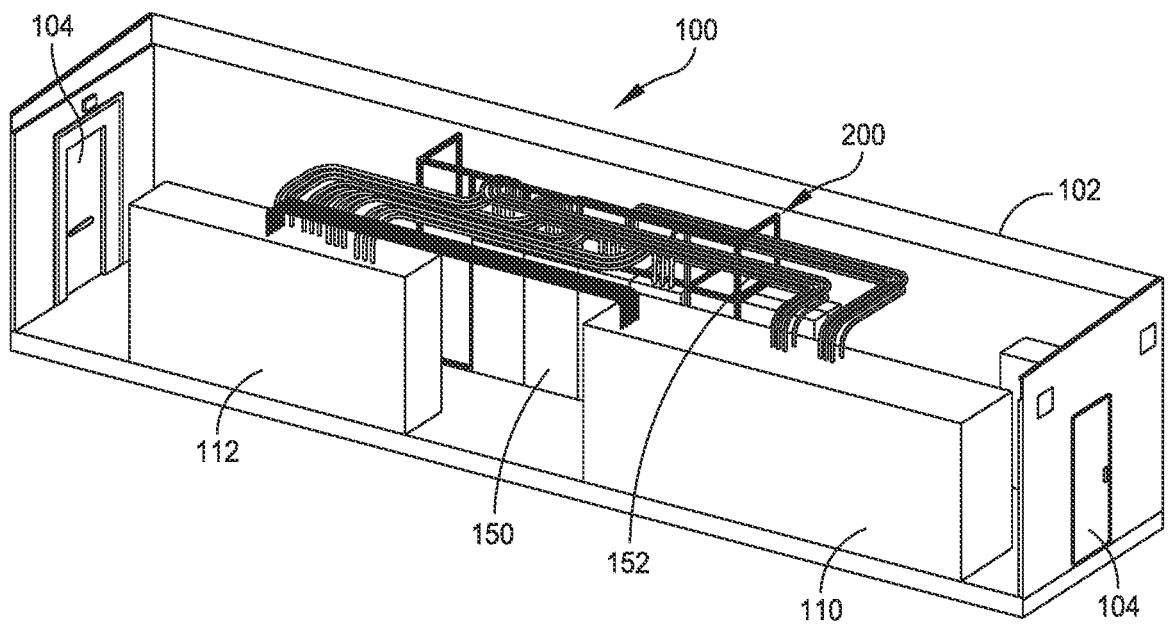
FIG. 1 is a perspective view of a prefabricated power module with portions removed to reveal an electrical input switchgear, an electrical output switchgear, and an airflow management system of an embodiment of the present disclosure having top air exhaust.

This disclosure is not limited in its application to the details of construction and the arrangement of components set forth in the following description or illustrated in the drawings. The principles set forth in this disclosure are capable of being provided in other embodiments and of being practiced or of being carried out in various ways. Also, the phraseology and terminology used herein is for the purpose of description and should not be regarded as limiting. The use of "including," "comprising," "having," "containing," "involving," and variations thereof herein, is meant to encompass the items listed thereafter and equivalents thereof as well as additional items.

Prefabricated power modules offer flexibility of a pre-engineered solution and a quick deployment of a prefabricated module. Prefabricated power modules significantly reduce the complexity and time to deploy critical data center power by removing the time-consuming and difficult process of construction. Data center power modules offer scalable integrated uninterruptible power supply (UPS), switchgear and management software in a weatherproof enclosure. Such prefabricated power modules are available in different sizes and can be pre-engineered to meet a desired need. The modules include the most efficient components found in data centers, and offer improved reliability. The modules offer flexibility and scalability to meet the particular needs of a customer.

A typical prefabricated power module may be designed to house a number of equipment racks. Cabling between the equipment racks may be implemented using cable distribution troughs contained on the roofs of the racks. Each equipment rack may be configured to include a frame or housing adapted to support electronic components, such as data processing, networking and telecommunications equipment. The housing includes a front, a back, opposite sides, a bottom and a top. The front of each equipment rack may include a front door so as to enable access into the interior of the equipment rack. The sides of the equipment rack may include at least one panel to enclose the interior region of the rack. The back of the equipment rack may also include at least one panel or a back door to provide access to the interior of the equipment rack from the back of the rack.

The equipment racks are modular in construction, and can be configured to be positioned within a row of the prefabricated power module. Once in position, or prior to being positioned within the row, electronic equipment may be placed in the interior region of the equipment rack. For example, the equipment may be placed on shelving secured within the interior region of the equipment rack. Cables providing electrical and data communication may be provided through the top of the equipment rack either through a cover (or "roof") at the top of the equipment rack having openings formed therein or through an open top of the equipment rack. In this embodiment, the cables may be strung along the roofs of the racks or be provided in the aforementioned cable distribution troughs. In another embodiment, the cables may be disposed within a raised floor and connected to the electronic equipment through the bottom of the equipment rack. With both configurations, power and communication lines are provided to and from the equipment racks.

As discussed above, prefabricated power modules are typically configured with a row of equipment racks arranged such that cool air is drawn into the racks from a cold aisle and warm or hot air is exhausted from the racks into a hot aisle. In other embodiments, cool air is drawn into the racks from a cold aisle and warm or hot air is exhausted from the racks into a hot air plenum provided above the row of equipment racks. In order to address the heat build-up and hot spots within the prefabricated power module, and to address climate control issues within the prefabricated power module in general, a cooling system may be provided. In one configuration, the cooling system may be provided as part of the prefabricated power module infrastructure. In another configuration, the prefabricated power module's cooling system may be supplemented with the traditional in-row cooling units described above.

In one embodiment, a management system may be provided to monitor and display conditions of an in-row cooling unit or of multiple in-row cooling units. The management system may operate independently to control the operation of the in-row cooling unit, and may be configured to communicate with a higher-level network manager or with a management system associated with the equipment storage racks. For example, in a particular embodiment, a controller may be provided to control the operation of the in-row cooling units. The controller may be a dedicated unit to the cooling system of the prefabricated power module. In another embodiment, the controller may be provided as part of an integrated prefabricated power module control and monitoring system. In yet another embodiment, each in-row cooling unit may be independently operable by a controller provided in the in-row cooling unit that is in communication with controllers of the other in-row cooling units. Notwithstanding the particular configuration, the controller is designed to control the independent operation of the in-row cooling units within the prefabricated power module.

Referring now to the drawings, and more particularly to FIG. 1, there is generally indicated at 100, a prefabricated power module of an embodiment of the present disclosure. As shown, the power module 100 includes a generally rectangular structure 102 that can be sized and shaped to house desired equipment. The power module 100 provides a mobile solution having a form, look and feel that is similar to that of standard fixed data centers, providing professionals that utilize the data centers with a comfortable, familiar environment. In addition, at least some embodiments utilize standard equipment in the power module 100 that is readily available and accepted for use. In one embodiment, equipment enclosures, uninterruptible power supplies, air conditioning systems and other equipment in the power module 100 may be implemented. In at least one embodiment, the power module 100 can be implemented using a standard trailer, such as those approved by the U.S. Department of Transportation for travel on U.S. highways. The ability to use standard trailers is particularly desirable as it allows the power modules to be easily transported as necessary.

In one embodiment, the power module 100 is a standalone system that includes rack enclosure space to house electronics equipment, such as uninterruptible power supplies (UPSs), power distribution units (PDUs), servers, telecommunications equipment, cooling equipment, and the like. In other embodiments, additional rack enclosure space may be included in the structure 102 of the power module 100. In other embodiments, the electronics equipment is housed within an ISO frame, which constitutes structure 102. As shown, the structure 102 of the power module 100 includes access doors, each indicated at 104, which are provided at the ends of the structure and allow personnel access into the power module. The interior of the structure 102 of the power module 100 is configured to include electrical input switchgear 110 and electrical output switchgear 112.

Figure 2:
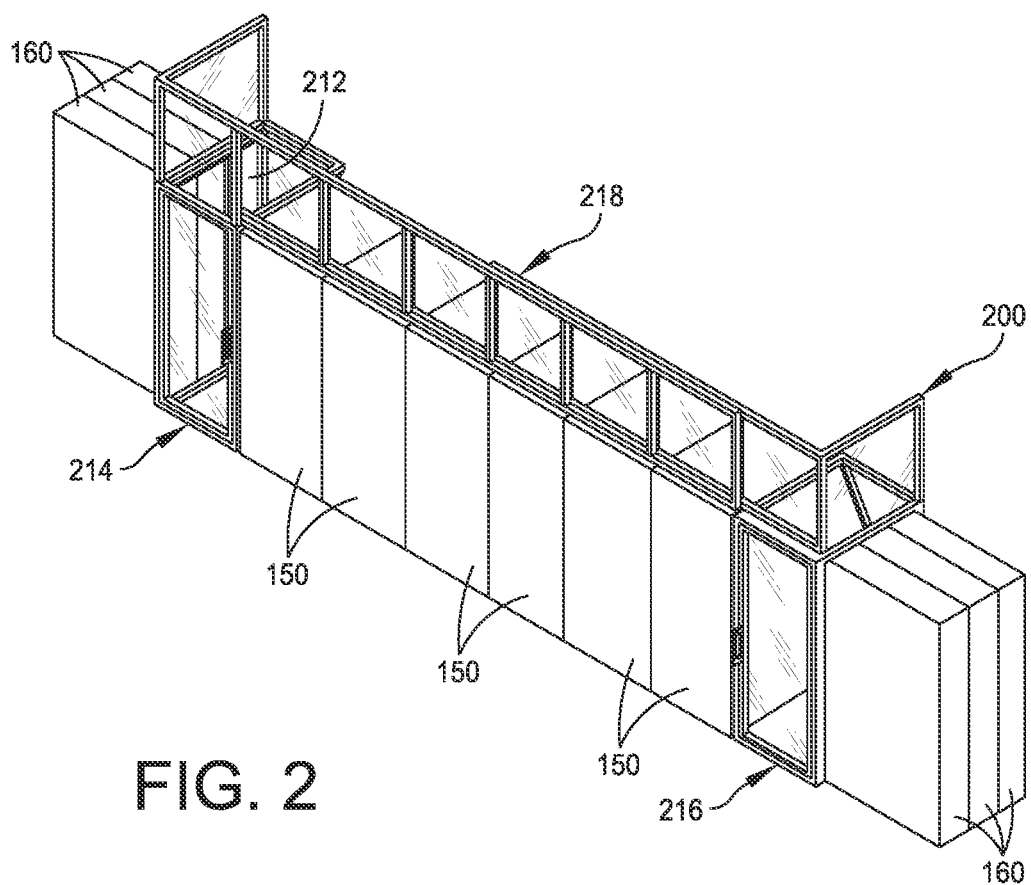
FIG. 2 is a perspective view of the airflow management system shown in FIG. 1.

Referring additionally to FIG. 2, the interior of the structure 102 of the power module 100 further supports an airflow management system, generally indicated at 200, which is configured to enclose electronic equipment racks, each indicated at 150. In one embodiment, the equipment racks 150 are UPSs. As shown, suitable cables 152 are provided to couple the electrical input switchgear 110 and the electrical output switchgear 112 to one another and to the electronic equipment racks 150 housed by the airflow management system 200. In the shown embodiment, the airflow management system 200 is designed to accommodate top air exhaust UPSs 150, which are each configured to exhaust warm or hot air through a top of the UPS. In one embodiment, the UPS 150 is a GVX UPS offered by Schneider Electric, which is a 500-3000 kilowatt (kW) system. Further provided in the interior of the structure 102 of the power module 100 are cooling units, each indicated at 160. As with the UPSs 150, suitable cabling can be provided to provide power and control to the cooling units 160. In one embodiment, the cooling unit 160 embodies an in-row cooling unit, with the number of cooling units being determined by the amount of cooling needed to cool the equipment racks 150. The power module 100 is configured to ensure that the in-row cooling units 160 comply with NEC Code for working clearances and meet service access clearance requirements.

In the embodiment shown in FIG. 2, the airflow management system 200 is configured to accommodate six UPSs 150, which are positioned in a row. As mentioned, the UPSs 150 are configured to exhaust warm or hot air through the tops of the UPSs. The airflow management system 200 is configured to direct the warm air to the ends of the system to cooling units 160. There are six in-row cooling units 160 provided to cool the warm air, with three cooling units provided at one end of the airflow management system and three cooling units provided at the other end of the of the airflow management system 200. The structure of the airflow management system 200 will be described in greater detail below.

Figure 3A:
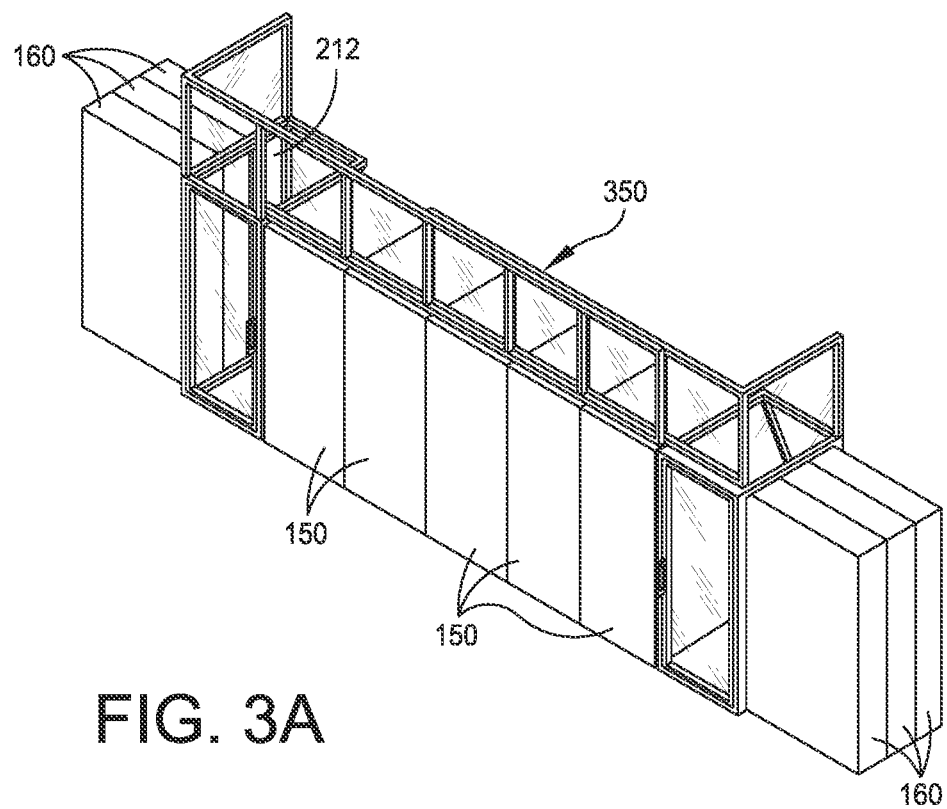
FIGS. 3A-3D are perspective views of airflow management systems having top air exhaust of embodiments of the present disclosure.

FIG. 3A illustrates an airflow management system, generally indicated at 350, which is configured to accommodate five UPSs 150, which is positioned in a row. As shown, there are five in-row cooling units 160, with two cooling units provided at one end of the airflow management system 350 and three cooling units provided at the other end of the airflow management system. One or more blanking panels may be used to block the opening left open by the removed in-row cooling unit. The blanking panel may be permanently affixed in place or may be removable.

Figure 3B:
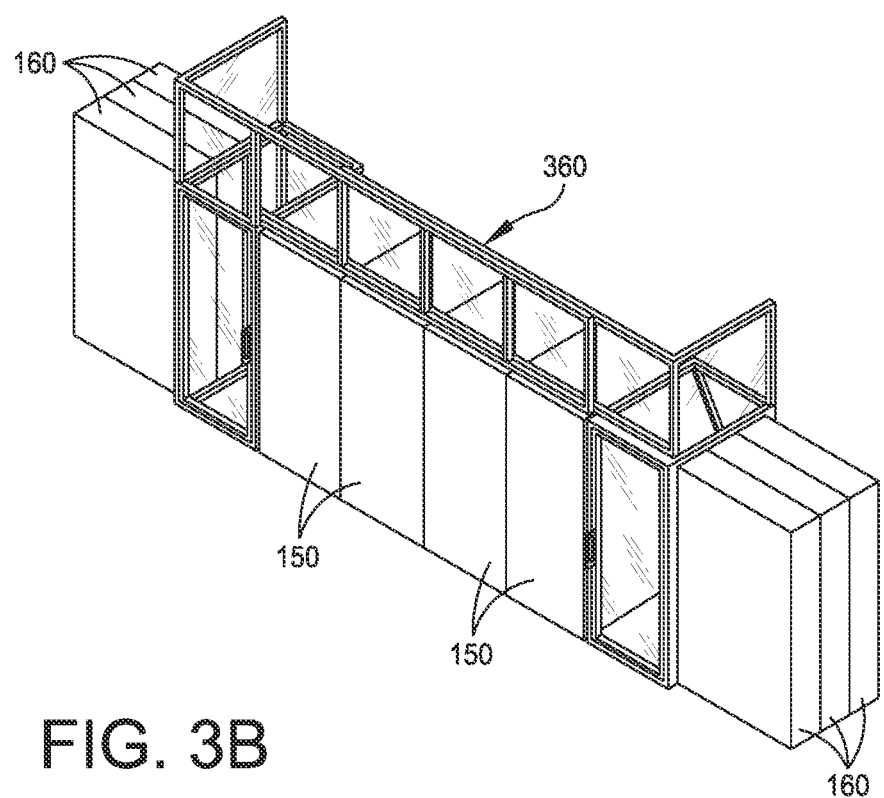

FIG. 3B illustrates an airflow management system, generally indicated at 360, which is configured to accommodate four UPSs 150, which is positioned in a row. As shown, there are four in-row cooling units 160, with two cooling units provided at one end of the airflow management system 360 and two cooling units provided at the other end of the airflow management system. One more blanking panels may be used to block the openings left open by the removed in-row cooling units. The blanking panel may be permanently affixed in place or may be removable.

Figure 3C:
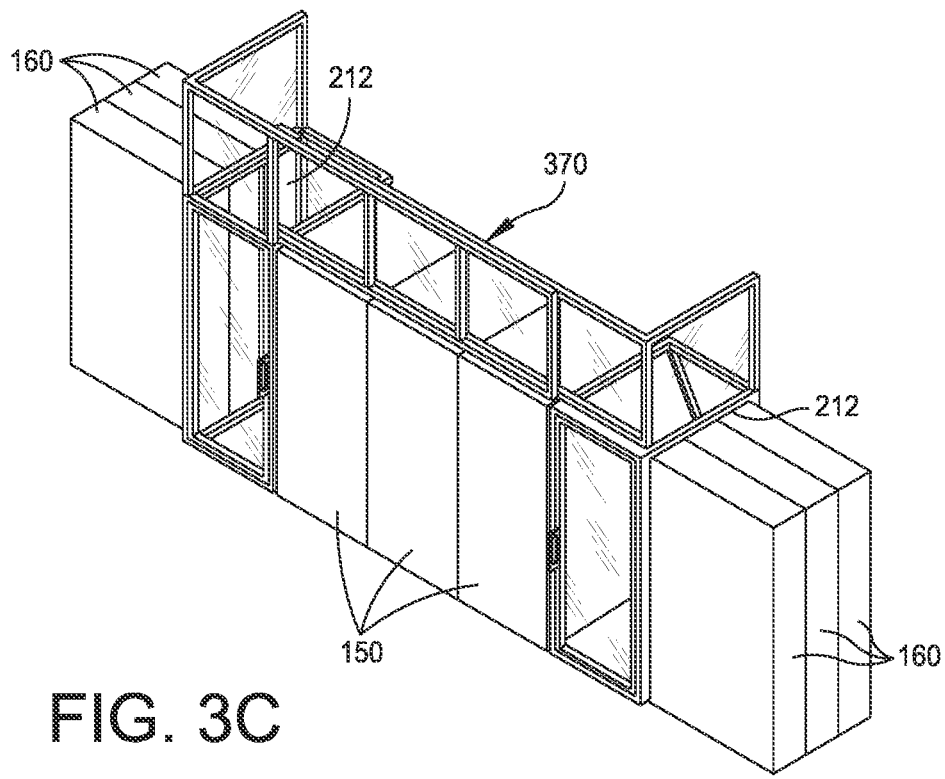

FIG. 3C illustrates an airflow management system, generally indicated at 370, which is configured to accommodate three UPSs 150, which is positioned in a row. As shown, there are four in-row cooling units 160, with two cooling units provided at one end of the airflow management system 370 and two cooling units provided at the other end of the airflow management system. One or more blanking panels may be used to block the openings left open by the removed in-row cooling units. The blanking panel may be permanently affixed in place or may be removable.

Figure 3D:
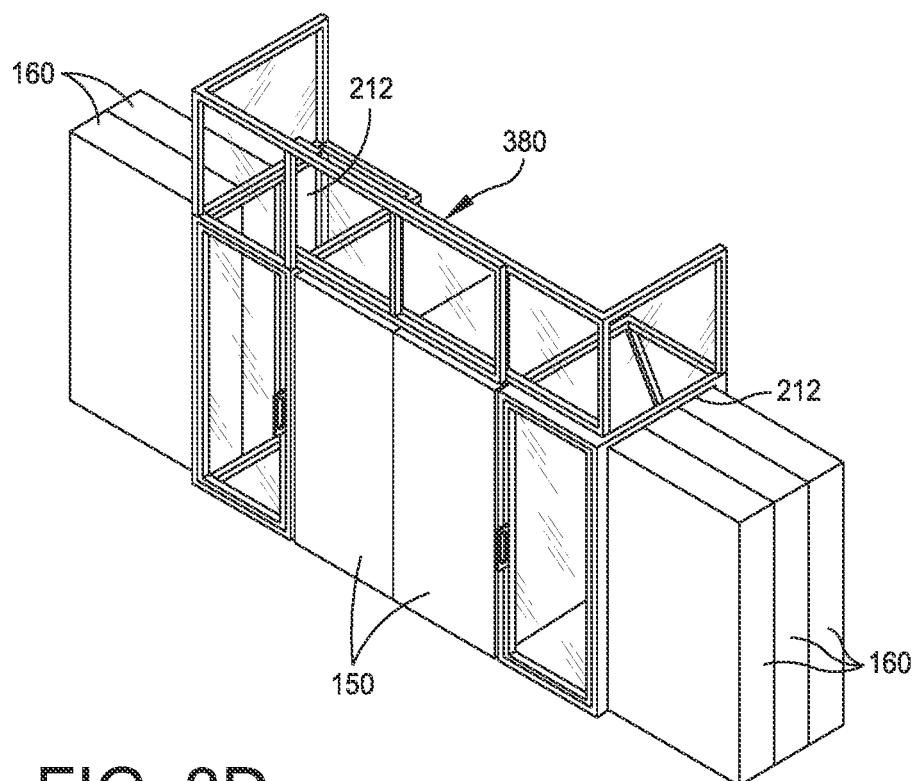

FIG. 3D illustrates an airflow management system, generally indicated at 380, which is configured to accommodate two UPSs 150, which is positioned in a row. As shown, there are four in-row cooling units 160, with two cooling units provided at one end of the airflow management system 380 and two cooling units provided at the other end of the airflow management system. One or more blanking panels may be used to block the openings left open by the removed in-row cooling units. The blanking panel may be permanently affixed in place or may be removable.

Figure 4:
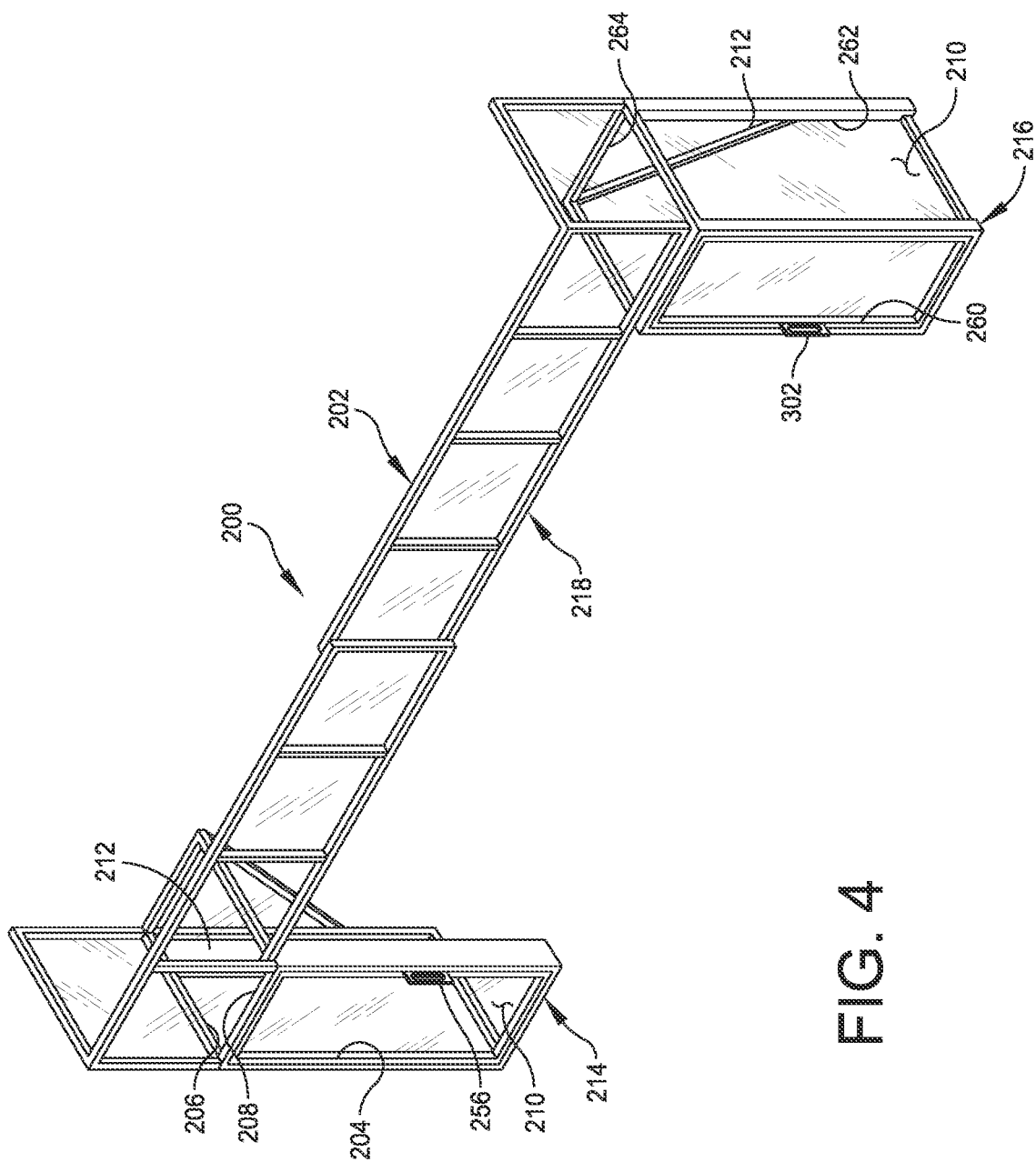
FIG. 4 is a perspective view of an airflow management system having top air exhaust of an embodiment of the present disclosure with equipment racks and cooling units removed for clarity.

Referring to FIG. 4, the airflow management system 200, sometimes referred to herein as a hot air containment system, is shown without the UPSs 150 and in-row cooling units 160. The airflow management system 200 embodies a service access partition including a frame assembly, generally indicated at 202, to provide three openings, a first opening 204, a second opening 206 and a third opening 208. The arrangement is such that the first opening 204 is provided to allow access to an access space 210 between the UPSs 150 and the cooling units 160. The access space 210 is of sufficient size to enable an operator to service and otherwise access the back or rear sides of the cooling units 160. The second opening 206 is provided to allow access to the cooling units 160 positioned at the end of the frame assembly 202. In some embodiments, where there are less than three cooling units 160, a blanking panel 212 may be installed to enclose the access space 210 as described above. The third opening 208 is provided to allow hot air to pass from the top air exhaust heat-generating equipment 150 to the access space 210.

Referring additionally to FIGS. 5A-5C, the frame assembly 202 includes a first frame subassembly generally indicated at 214 provided at one end of the top air exhaust heat-generating equipment 150, a second frame subassembly generally indicated at 216 provided at an opposite end of the top air exhaust heat-generating equipment, and a third frame subassembly generally indicated at 218 provided to connect the first frame subassembly 214 to the second frame subassembly 216. The first frame subassembly 214 includes a plurality of horizontal and vertical frame members that define the first opening 204, the second opening 206, and the third opening 208. Specifically, the first frame subassembly 214 includes two horizontal frame members 220, 222 and two vertical frame members 224, 226 to define the first opening 204, two horizontal frame members 228, 230 and two vertical frame members 224, 232 to define the second opening 206 and four horizontal frame members 220, 228, 240, 242 to define the third opening 208. Other frame members are provided to add support and structure to the first frame subassembly. For example, as shown in FIG. 5A, the first frame subassembly 214 includes three vertical frame members 244, 246, 248 and two horizontal frame members 250, 252. A support frame member 254 is further provided to support an outer edge of the frame members 240, 242 used to create the third opening 208.

As shown, the first frame subassembly 214 further includes a door 256, which is mounted on the vertical frame member 224 that defines the first opening. The door 256 can be hingedly mounted on either frame member 224, 226, and provided with a latching mechanism to secure the door in a closed position. The door 256 can include a door closer to automatically close the door to ensure that the air contained within the first frame subassembly 214. In other embodiments, the hinged door 256 can embody a removable panel or a sliding door. In one embodiment, door and the removable panel provide access to the access space 210. One or more blanking panels, e.g., similar to blanking panel 212, further can be provided to close or otherwise block portions of the second opening 206 in the event there is open space within the second opening. As mentioned above, when employing less than three in-row cooling units 160, a blanking panel, such as blanking panel 212, can be used to block the opening caused by providing less than three in-row cooling units.

Similar to the first frame subassembly 214, the second frame subassembly 216 includes a plurality of horizontal and vertical frame members that define a fourth opening 260, a fifth opening 262, and a sixth opening 264. Specifically, the second frame subassembly 216 includes two horizontal frame members 266, 268 and two vertical frame members 270, 272 to define the fourth opening 260, two horizontal frame members 274, 276 and two vertical frame members 270, 278 to define the fifth opening 262 and four horizontal frame members 266, 274, 286, 288 to define the sixth opening 264. Other frame members are provided to add support and structure to the second frame subassembly. For example, as shown in FIG. 5B, the second frame subassembly 216 includes three vertical frame members 290, 292, 294 and two horizontal frame members 296, 298. A support frame member 300 is further provided to support an outer edge of the frame members 286, 288 used to create the sixth opening 264 of the second frame subassembly 216.

As shown, the second frame subassembly 216 further includes a door 302, which is mounted on the vertical frame member 270 that defines the fourth opening 260. The door 302 can be hingedly mounted on either frame member 272, 274, and provided with a latching mechanism to secure the door in a closed position. The door 302 can include a door closer to automatically close the door to ensure that the air contained within the second frame subassembly 216. One or more blanking panels, similar to blanking panel 212, further can be provided to close or otherwise block portions of the fifth opening 262 in the event there is open space within the fifth opening. As mentioned above, when employing less than three in-row cooling units 152, a blanking panel, such as blanking panel 212, can be used to block the opening caused by providing less than three in-row cooling units.

The third frame subassembly 218 is used to span and define a plenum above the heat-generating equipment 150 between the first frame subassembly 214 and the second frame subassembly 216. As shown, the third frame subassembly 218 includes a plurality of horizontal and vertical frame members that define several segments, e.g., six, each indicated at 310, that can be enclosed with transparent, opaque or solid panels, each indicated at 312. See through or transparent panels are shown in FIG. 5C. There is one segment for each UPS 150 provided. The third frame subassembly 218 can be sized to accommodate a desired number of heat-generating equipment 150. Specifically, a length of the third frame subassembly 218 can be adjusted to accommodate different UPS configurations, as shown in FIGS. 3A-3D, e.g., airflow management systems 350, 360, 370, 380.

Since space is limited in within the prefabricated power module 100, it is difficult to use in-row cooling units, which need to comply with NEC Code for working clearances and meet in-row service access clearance requirements. The airflow management system 200 disclosed herein makes it feasible to use in-row cooling units by turning them parallel to a length of the heat-generating equipment as show. The airflow management system 200 employs a free-standing system, suitably attached or secured to floor and/or wall structural members, and therefore does not have to be supported by the UPSs 150 and/or the in-row cooling units 160. However, in some embodiments, the airflow management system can be secured or otherwise supported by the UPSs 150 and/or the in-row cooling units 160. The airflow management system 200 provides a flexible and modular design that allows for additional UPS s 150 and in-row cooling units 160 to be added or subtracted to meet changing customer demands.

Figure 6:
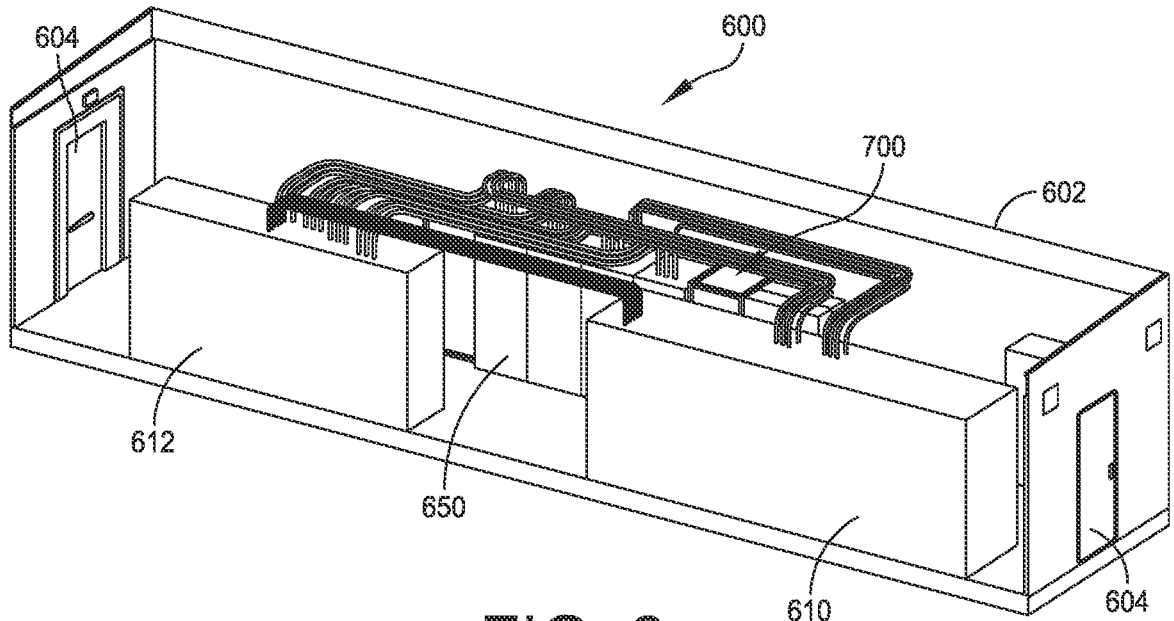
FIG. 6 is a perspective view of a prefabricated power module with portions removed to reveal an electrical input switchgear, an electrical output switchgear, and an airflow management system of an embodiment of the present disclosure having rear air exhaust.

The airflow management system 200 described with reference to FIGS. 1-5C is configured to accommodate heat-generating equipment 150 that directs warm or hot air through the top of the heat-generating equipment. Referring to FIG. 6, there is generally indicated at 600, a prefabricated power module of another embodiment of the present disclosure. As shown, the power module 600 includes a generally rectangular structure 602 that can be sized and shaped to house desired equipment. As shown, the structure 602 of the power module 600 includes access doors, each indicated at 604, which are provided at the ends of the structure and allow personnel access into the power module. The interior of the structure 602 of the power module 600 is configured to include electrical input switchgear 610 and electrical output switchgear 612.

Figure 7:
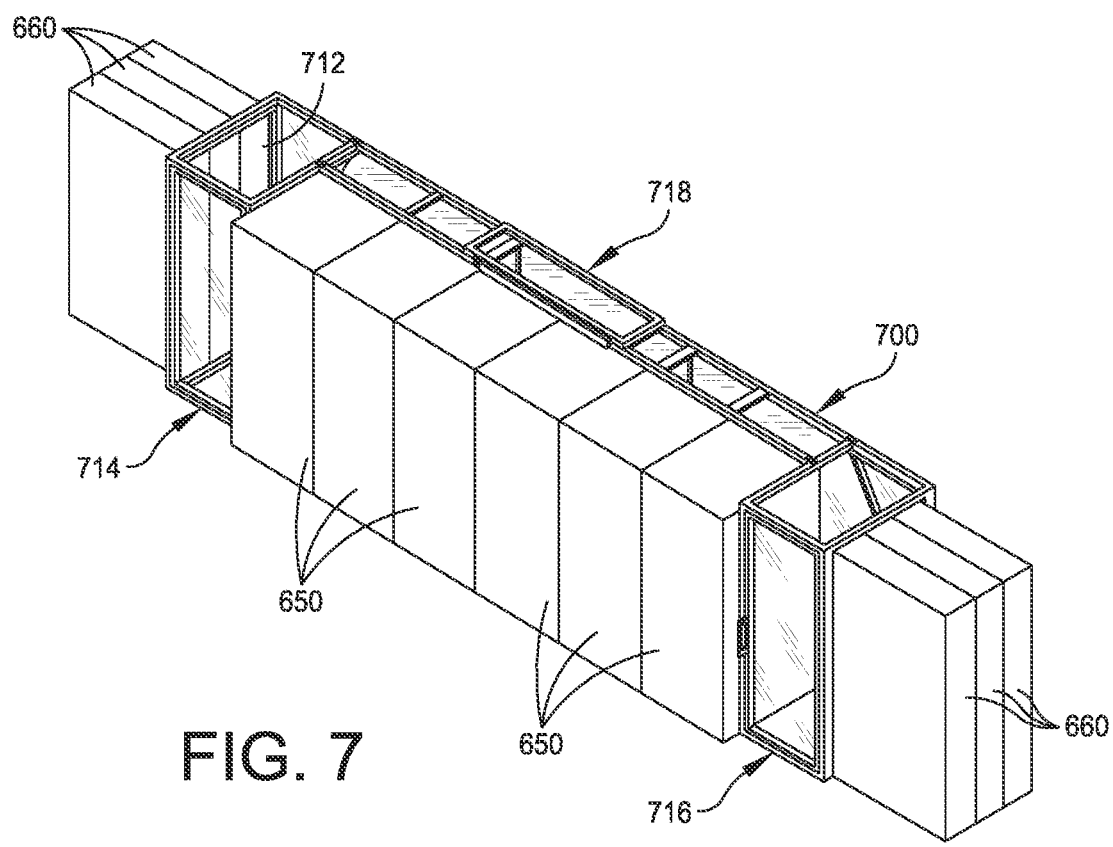
FIG. 7 is a perspective view of the airflow management system shown in FIG. 6.

Referring additionally to FIG. 7, the interior of the structure 602 of the power module 600 further supports an airflow management system, generally indicated at 700, which is configured to enclose electronic equipment racks, each indicated at 650. In the shown embodiment, the airflow management system 700 is designed to accommodate rear air exhaust UPSs 650, which are each configured to exhaust warm or hot air through the back or rear of the UPS. In one embodiment, the UPS 650 is a GVL UPS offered by Schneider Electric, which is a 200-500 kW system. Further provided in the interior of the structure 602 of the power module 600 are cooling units, each indicated at 660. In one embodiment, the cooling unit 660 embodies an in-row cooling unit, with the number of cooling units being determined by the amount of cooling needed to cool the equipment racks 650.

In the embodiment shown in FIG. 7, the airflow management system 700 is configured to accommodate six UPSs 650, which are positioned in a row. As mentioned, the UPSs 650 are configured to exhaust warm or hot air through the backs of the UPSs. The airflow management system 700 is configured to direct the warm air to the ends of the system to cooling units 660. There are six in-row cooling units provided to cool the warm air, with three cooling units provided at one end of the airflow management system 700 and three cooling units provided at the other end of the of the airflow management system.

Figure 8A:
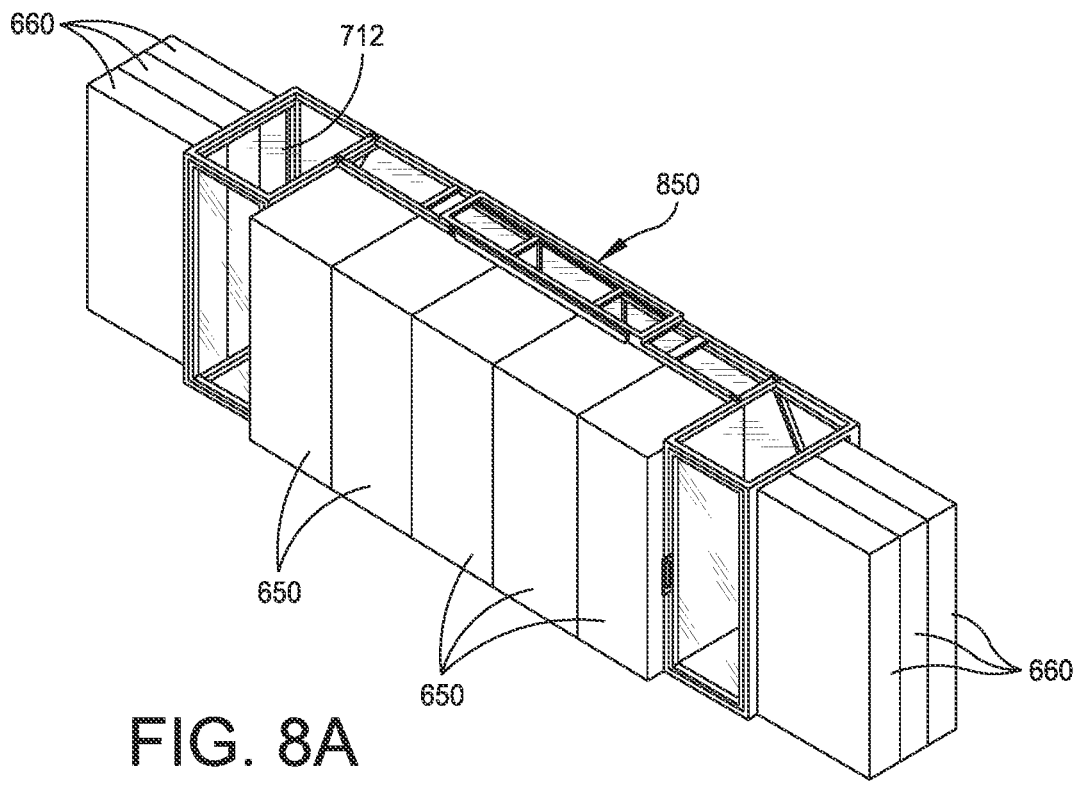
FIGS. 8A-8D are perspective views of airflow management systems having rear air exhaust of embodiments of the present disclosure.

FIG. 8A illustrates an airflow management system, generally indicated at 850, which is configured to accommodate five UPSs 650, which are positioned in a row. As shown, there are five in-row cooling units 660, with two cooling units provided at one end of the airflow management system 850 and three cooling units provided at the other end of the airflow management system. One or more blanking panels may be used to block the opening left open by the removed in-row cooling unit. The blanking panel may be permanently affixed in place or may be removable.

Figure 8B:
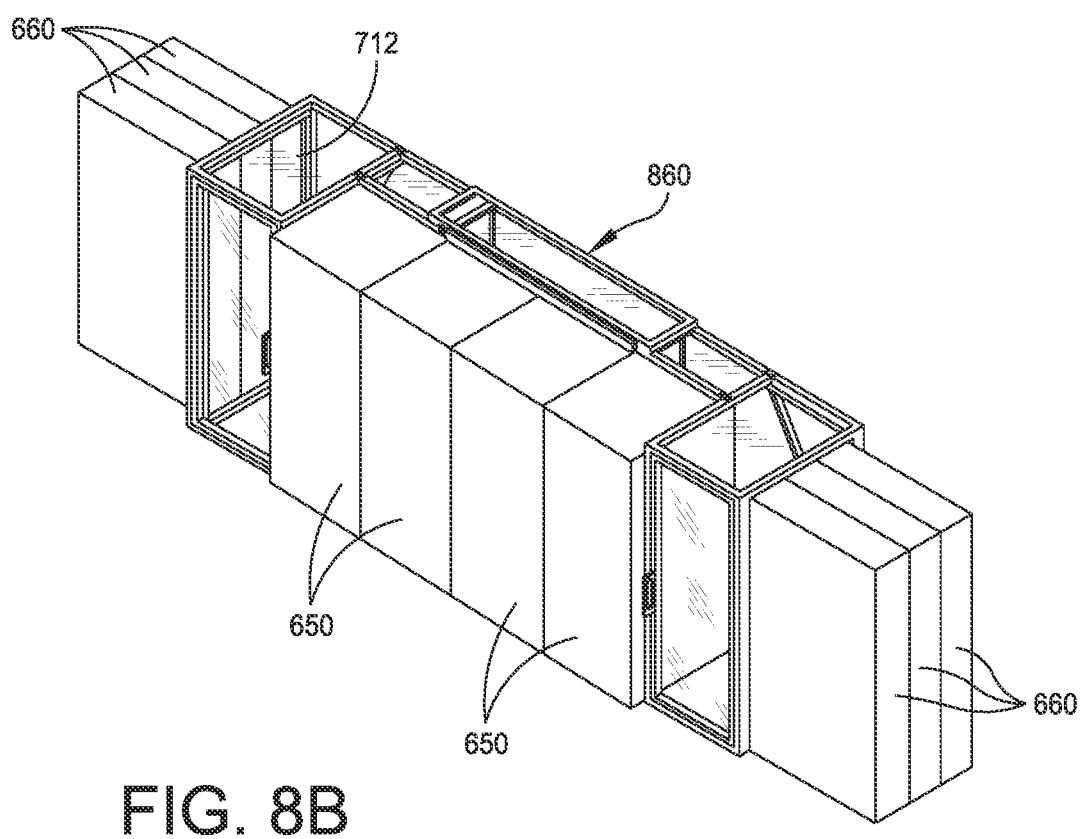

FIG. 8B illustrates an airflow management system, generally indicated at 860, which is configured to accommodate four UPSs 650, which is positioned in a row. As shown, there are four in-row cooling units 660, with two cooling units provided at one end of the airflow management system 860 and two cooling units provided at the other end of the airflow management system. One or more blanking panels may be used to block the opening left open by the removed in-row cooling unit. The blanking panel may be permanently affixed in place or may be removable.

Figure 8C:
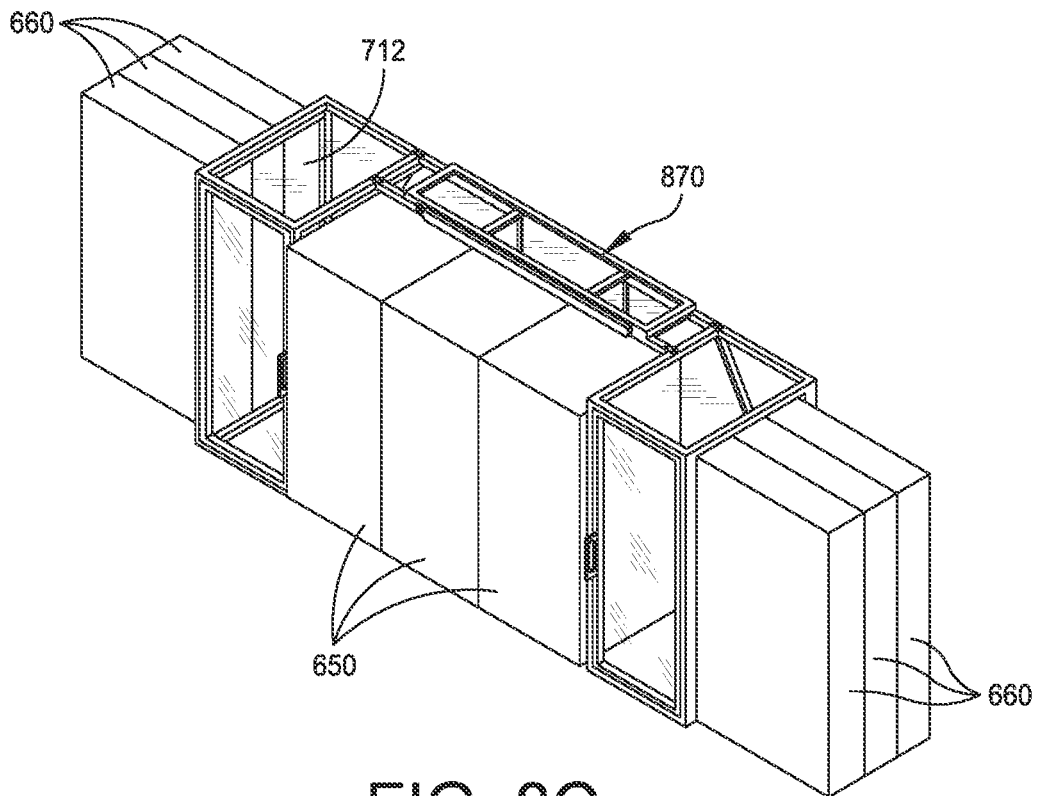

FIG. 8C illustrates an airflow management system, generally indicated at 870, which is configured to accommodate three UPSs 650, which is positioned in a row. As shown, there are four in-row cooling units 660, with two cooling units provided at one end of the airflow management system 870 and two cooling units provided at the other end of the airflow management system. One or more blanking panels may be used to block the opening left open by the removed in-row cooling unit. The blanking panel may be permanently affixed in place or may be removable.

Figure 8D:
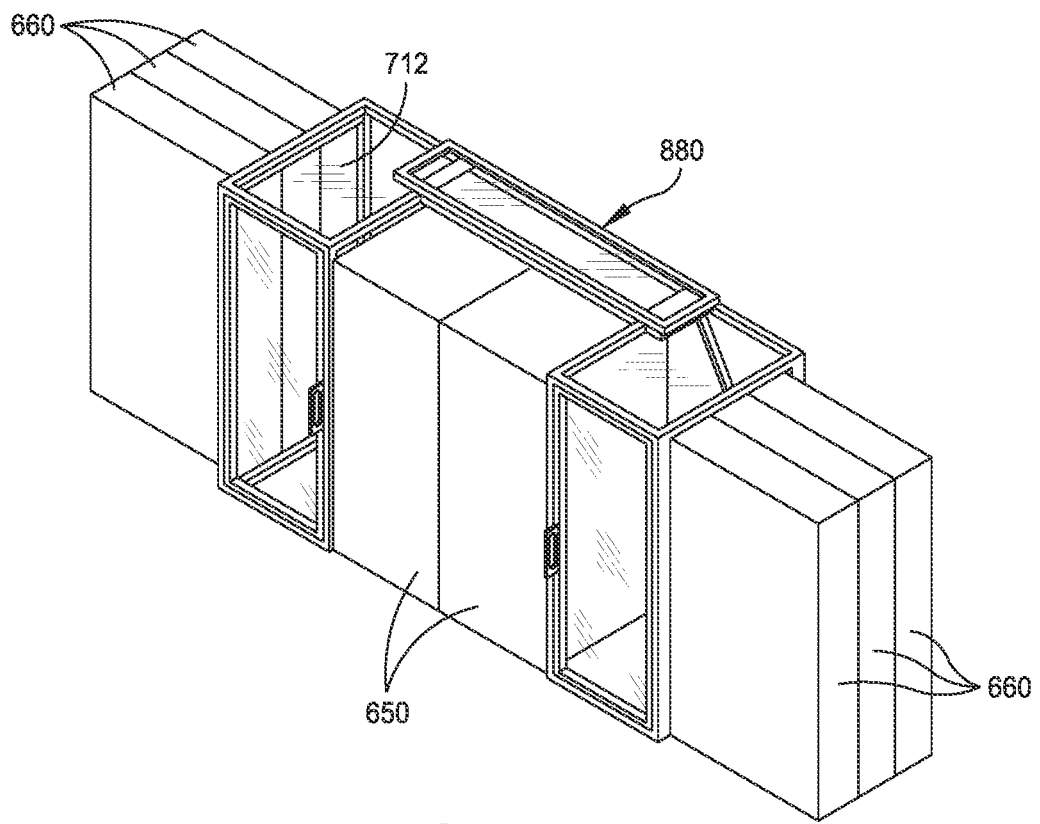
Figure 11:
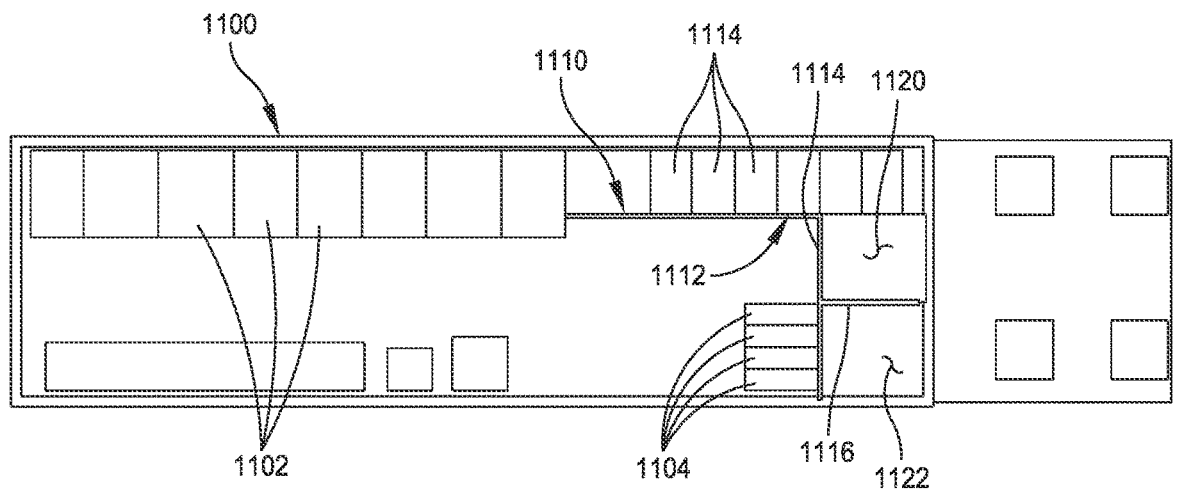
FIGS. 11-14 are views of an airflow management system of another configuration of an embodiment of the present disclosure.
Figure 12:
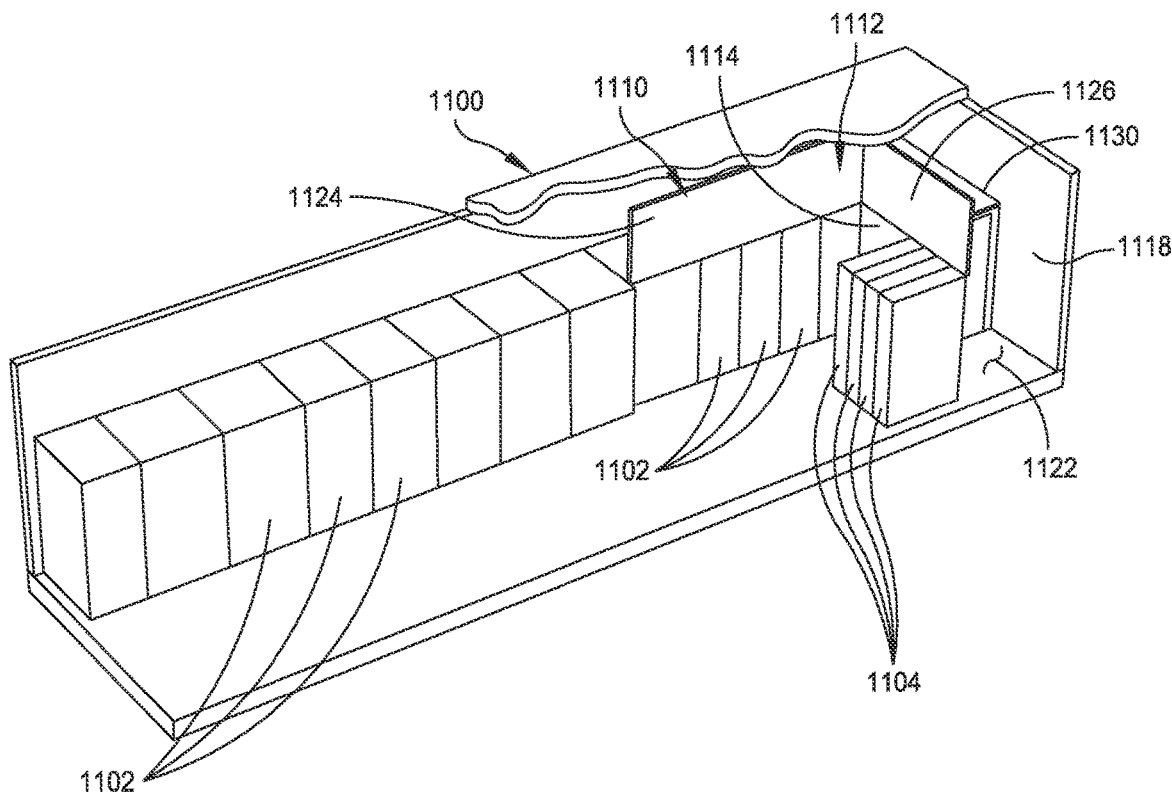
Figure 13:
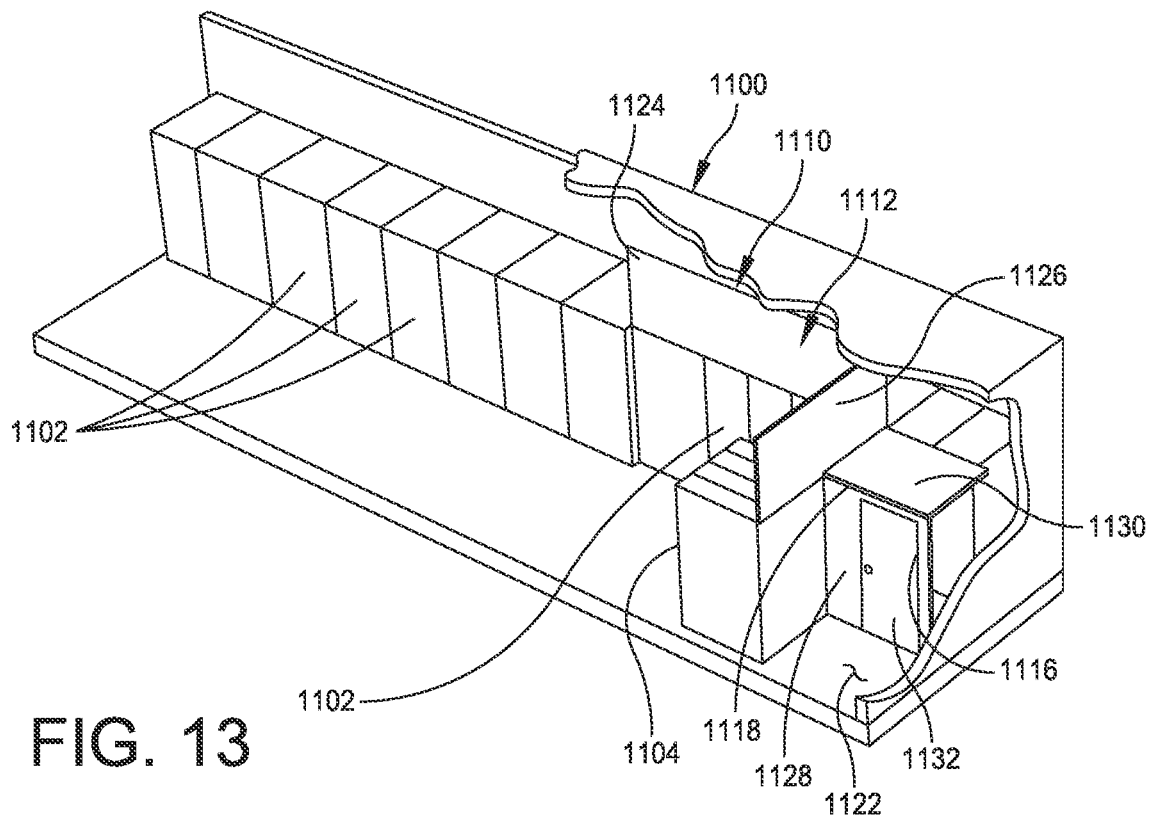
Figure 14:
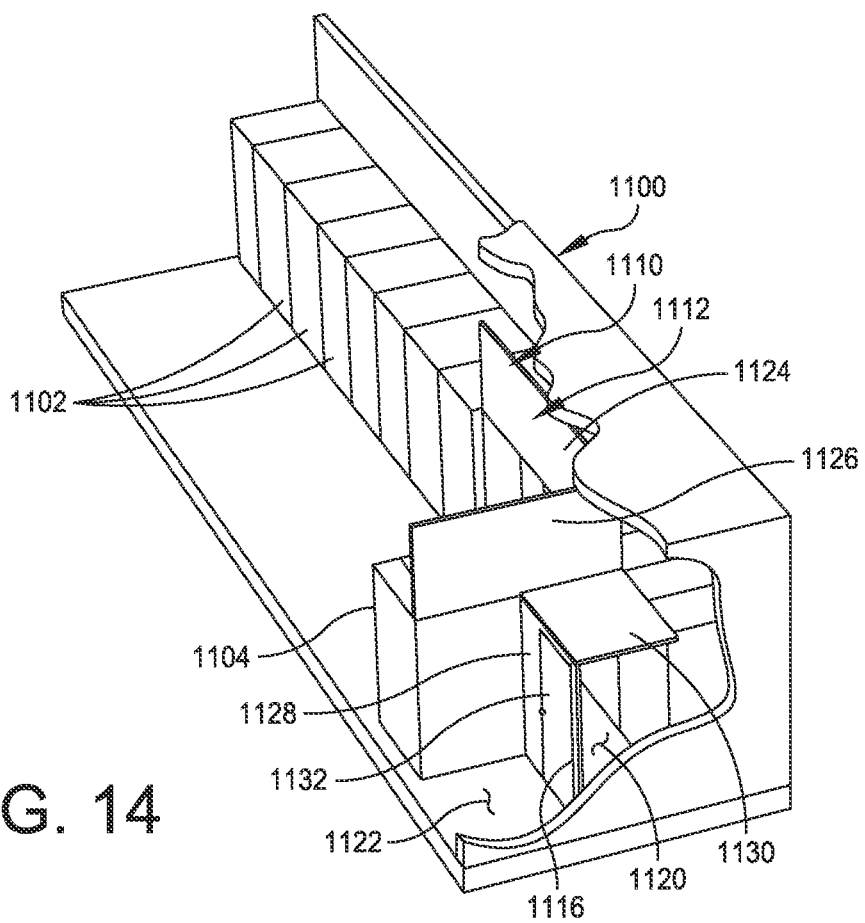

FIG. 8D illustrates an airflow management system, generally indicated at 880, which is configured to accommodate two UPSs 650, which is positioned in a row. As shown, there are four in-row cooling units 660, with two cooling units provided at one end of the airflow management system 880 and two cooling units provided at the other end of the airflow management system. One or more blanking panels may be used to block the opening left open by the removed in-row cooling unit. The blanking panel may be permanently affixed in place or may be removable.

Referring to FIG. 9, the airflow management 700 is shown without the UPSs 650 and in-row cooling units 660. The airflow management system 700 embodies a service access partition including a frame assembly generally indicated at 702 to provide three openings, a first opening 704, a second opening 706 and a third opening 708. The arrangement is such that the first opening 704 is provided to allow access to an access space 710 between the UPSs 650 and the cooling units 660. The access space 710 is of sufficient size to enable an operator to service and otherwise access the back or rear sides of the cooling units 660. The second opening 706 is provided to allow access to the cooling units 660 positioned at the end of the frame assembly 702. In some embodiments, where there are less than three cooling units 660, a blanking panel 712 may be installed to enclose the access space 710 as described above. The third opening 708 is provided to allow hot air to pass from the rear air exhaust heat-generating equipment 650 to the access space 710.

Referring additionally to FIGS. 10A-10C, the frame assembly 702 includes a first frame subassembly generally indicated at 714 provided at one end of the top air exhaust heat-generating equipment 650, a second frame subassembly generally indicated at 716 provided at an opposite end of the top air exhaust heat-generating equipment, and a third frame subassembly generally indicated at 718 provided to connect the first frame subassembly 714 to the second frame subassembly 716. The first frame subassembly 714 includes a plurality of horizontal and vertical frame members that define the first opening 704, the second opening 706, and the third opening 708. Specifically, the first frame subassembly 714 includes two horizontal frame members 720, 722 and two vertical frame members 724, 726 to define the first opening 704, two horizontal frame members 728, 730 and two vertical frame members 724, 732 to define the second opening 706, and an open end to define the third opening 708. Horizontal support members 740, 742 are supported by a support frame member 754.

As shown, the first frame subassembly 714 further includes a door 756, which is mounted on the vertical frame member 724 that defines the first opening 704. The door 756 can be hingedly mounted on either frame member 724, 726, and provided with a latching mechanism to secure the door in a closed position. The door 756 can include a door closer to automatically close the door to ensure that the air contained within the first frame subassembly 714. In other embodiments, the hinged door 256 can embody a removable panel or a sliding door. One or more blanking panels, similar to blanking panel 712, further can be provided to close or otherwise block portions of the second opening 706 in the event there is open space within the second opening. As mentioned above, when employing less than three in-row cooling units 660, a blanking panel, such as blanking panel 712, can be used to block the opening caused by providing less than three in-row cooling units.

Similar to the first frame subassembly 714, the second frame subassembly 716 includes a plurality of horizontal and vertical frame members that define a fourth opening 760, a fifth opening 762, and a sixth opening 764. Specifically, the second frame subassembly 716 includes two horizontal frame members 766, 768 and two vertical frame members 770, 772 to define the fourth opening 760, two horizontal frame members 774, 776 and two vertical frame members 770, 778 to define the fifth opening 762, and an open end to define the third opening 708. Horizontal support members 780, 782 are supported by a support frame member 800.

As shown, the second frame subassembly 716 further includes a door 802, which is mounted on the vertical frame member 770 that defines the fourth opening 760. The door 802 can be hingedly mounted on either frame member 770, 772, and provided with a latching mechanism to secure the door in a closed position. The door 802 can include a door closer to automatically close the door to ensure that the air contained within the second frame subassembly 716. One or more blanking panels, similar to blanking panel 712, further can be provided to close or otherwise block portions of the fifth opening 762 in the event there is open space within the fifth opening. As mentioned above, when employing less than three in-row cooling units 660, a blanking panel, such as blanking panel 712, can be used to block the opening caused by providing less than three in-row cooling units.

The third frame subassembly 718 is used to span and define a plenum behind the heat-generating equipment 650 between the first frame subassembly 714 and the second frame subassembly 716. As shown, the third frame subassembly 718 includes two horizontal frame members 810, 812, and a window segment 814 supported by the horizontal frame members. In one embodiment, the window frame segment 814 can include a transparent panel; however, it may include opaque or solid panels. A transparent panel is shown in FIG. 10C. The third frame subassembly 718 can be sized to accommodate a desired number of heat-generating equipment 650. Specifically, a length of the third frame subassembly 718 can be adjusted to accommodate different UPS configurations, as shown in FIGS. 8A-8D, e.g., airflow management systems 850, 860, 870, 880.

Referring to FIGS. 11-14, another embodiment of an airflow management system used in prefabricated power module is shown and described. As shown, a prefabricated power module, generally indicated at 1100, includes several UPSs, each indicated at 1102, and several in-row cooling units, each indicated at 1104. The prefabricated power module 1100 includes an airflow management system, generally indicated at 1110, which embodies a service access partition including an assembly generally indicated at 1112 configured to provide three openings, a first opening 1114, a second opening 1116, and a third opening 1118. The arrangement is such that the first opening 1114 is provided to allow access to a first access space 1120 provided between the UPSs 1102 and the cooling units 1104. The first access space 1120 is of sufficient size to enable an operator to service the UPSs provided along a side of the first access space. The second opening 1116 is provided to allow access to a second access space 1122 provided to access the back or rear sides of the cooling units 1104. In some embodiments, where there are less than three cooling units, a blanking panel, similar to blanking panels 212 and 712, may be installed to enclose the second access space 1122 as described above. The third opening 1118 is provided to allow hot air to pass from the air exhaust heat-generating equipment 1102 to the second access space 1122.

The assembly 1112 is provided at one end of the heat-generating equipment 1102 and includes several panels to provide air containment within the prefabricated power module 1100. The assembly 1112 includes a plurality of horizontal and vertical frame panels that define the first opening 1114, the second opening 1116, and the third opening 1118. A first vertical panel 1124 and a second vertical panel 1126 are provided to channel warm or hot air generated by the UPSs 1102 through the third opening 1118 to the cooling units 1104. A third vertical panel 1128 is provided to provide access from the first access space 1120 to the second access space 1122 through the second opening 1116. A horizontal panel 1130 is provided to cover the first access space 1120 and provides fluid communication to the second access space 1122. The panels 1124, 1126, 1128, 1130 can be constructed in a manner similar to the construction of the frame assemblies 202, 702 described above with reference to airflow management systems 200, 700, respectively.

As shown, the third vertical panel 1128 includes a door 1132, which is suitably mounted on the third vertical panel and is provided to define the second opening 1116. The door 1132 can be hingedly mounted on the third vertical panel 1128, and provided with a latching mechanism to secure the door in a closed position. The door 1132 can include a door closer to automatically close the door to ensure that the air contained between the first access space 1120 and the second access space 1122. In other embodiments, the hinged door 256 can embody a removable panel or a sliding door.

In some embodiments, the airflow management system makes it feasible to use in-row cooling units in a prefabricated power module.

In some embodiments, the airflow management system provides a low-cost solution to enhance cooling capacity with a high efficiency, modular design, easy access and service.

In some embodiments, the airflow management system functions to optimize airflow and make cable routing easier within the prefabricated power module.

In some embodiments, the airflow management system is provided as a free-standing unit, which is attached to the floor and/or wall structural members, and therefore are not supported by the UPSs and/or the in-row cooling units.

In some embodiments, the airflow management system employs a flexible and modular design that allows for additional UPSs and in-row cooling units to be added or removed to meet changing customer demands.

In some embodiments, the airflow management system is configured to arrange in-row cooling units perpendicular to UPSs. This arrangement allows the in-row cooling units to deliver cold supply air away from the UPSs toward the ends of the prefabricated power module, with the cold air recirculating back to the front of UPSs and captured by the active fans within the UPSs. The airflow paths provided by the airflow management systems described herein eliminate assist in evenly controlling temperatures throughout the power module.

In some embodiments, the airflow management system can be first installed, with the UPSs and the in-row cooling units being installed at a later time. Thus, UPSs and in-row cooling units can be removed and replaced without needing to temporarily support the containment system.

In some embodiments, the airflow management system offers flexibility to a customer to add more equipment (UPSs or in-row cooling units) as demand requires, which gives the customer maximum flexibility on increasing load and staging capital investment.

Having thus described several aspects of at least one embodiment of this disclosure, it is to be appreciated various alterations, modifications, and improvements will readily occur to those skilled in the art. Such alterations, modifications, and improvements are intended to be part of this disclosure, and are intended to be within the spirit and scope of the disclosure.

Accordingly, the foregoing description and drawings are by way of example only.

What is claimed is:

1. A hot air containment system configured to partially enclose heat-generating equipment, the hot air containment system comprising:
   a service access partition assembly including a first opening, a second opening, and a third opening provided at one end of the hot air containment system, and a fourth opening, a fifth opening, and a sixth opening provided at an opposite end of the hot air containment system, wherein the first opening and the fourth opening are each configured to provide access to an access space, the second opening and the fifth opening are each configured to provide access to cooling equipment and to receive a blanking panel, and the third opening and the sixth opening are each configured to pass hot air from heat-generating equipment,
   the service access partition assembly further including a frame assembly having
      a first frame subassembly including a plurality of horizontal frame members and a plurality of vertical frame members provided at one end of the heat-generating equipment and configured to define the first opening on a first side of the first frame subassembly, the second opening provided on a second side of the first frame subassembly, the second side being perpendicular to the first side, and the third opening provided on a top side of the first frame subassembly,
      a second frame subassembly including a plurality of horizontal frame members and a plurality of vertical frame members provided at an opposite end of the heat-generating equipment and configured to define the fourth opening on a first side of the second frame subassembly that is parallel to the first side of the first frame subassembly, the fifth opening provided on a second side of the second frame subassembly that is parallel to the second side of the first frame subassembly, the second side being perpendicular to the first side, and the sixth opening provided on a top side of the second frame subassembly, and
      a third frame subassembly configured to connect the first frame subassembly to the second frame subassembly, the third frame subassembly being sized to accommodate a desired number of heat-generating equipment and to receive the hot air from the heat-generating equipment, wherein the second opening of the first frame subassembly and the fifth opening of the second frame subassembly are configured to receive cooling equipment.

2. The hot air containment system of claim 1, wherein each of the third opening and the sixth opening of the service access partition assembly are configured to allow hot air to pass from top air exhaust heat-generating equipment.

3. The hot air containment system of claim 1, wherein the cooling equipment includes at least one in-row cooling unit.

4. The hot air containment system of claim 1, wherein each of the first opening of the first frame subassembly and the second opening of the second frame subassembly includes an access door or removable panel.

5. A method of assembling an air containment system, the method comprising:
   providing a service access partition assembly including a first opening, a second opening, and a third opening, the first opening being configured to provide access to an access space, the second opening being configured to provide access to cooling equipment and to receive a blanking panel, and the third opening being configured to pass hot air from heat-generating equipment;
   positioning the first opening adjacent an access space;
   positioning the second opening adjacent cooling equipment;
   optionally securing a blanking panel to the service access partition assembly to block a portion of the second opening;
   positioning the third opening to enable hot air to pass from a row of inline heat generating equipment;
   positioning the fourth opening assembly adjacent another access space,
   positioning the fifth opening adjacent cooling equipment,
   optionally securing a blanking panel to the service access partition assembly to block a portion of the fifth opening, and
   positioning the sixth opening to enable hot air to pass from the row of inline heat generating equipment,
   wherein the service access partition assembly further including a frame assembly having a first frame subassembly including a plurality of horizontal frame members and a plurality of vertical frame members provided at one end of the heat-generating equipment and configured to define the first opening on a first side of the first frame subassembly, the second opening provided on a second side of the first frame subassembly, the second side being perpendicular to the first side, and the third opening provided on a top side of the first frame subassembly, a second frame subassembly including a plurality of horizontal frame members and a plurality of vertical frame members provided at an opposite end of the heat-generating equipment and configured to define the fourth opening on a first side of the second frame subassembly that is parallel to the first side of the first frame subassembly, the fifth opening provided on a second side of the second frame subassembly that is parallel to the second side of the first frame subassembly, the second side being perpendicular to the first side, and the sixth opening provided on a top side of the second frame subassembly, and a third frame subassembly configured to connect the first frame subassembly to the second frame subassembly, the third frame subassembly being sized to accommodate a desired number of heat-generating equipment and to receive the hot air from the heat-generating equipment, wherein the second opening of the first frame subassembly and the fifth opening of the second frame subassembly are configured to receive cooling equipment.

6. The method of claim 5, wherein each of the third opening and the sixth opening of the service access partition assembly are configured to allow hot air to pass from top air exhaust heat-generating equipment.

7. The method of claim 5, further comprising
securing the third frame subassembly at one end thereof to the first frame subassembly, and
securing the third frame subassembly at an opposite end thereof to the second frame subassembly.

8. The method of claim 5, wherein the cooling equipment includes at least one in-row cooling unit.

9. A hot air containment system configured to partially enclose heat-generating equipment, the hot air containment system comprising:
a first frame subassembly including a first opening, a second opening, and a third opening, the first opening being configured to provide access to an access space, the second opening being configured to provide access to cooling equipment and to receive a blanking panel, and the third opening being configured to pass hot air from heat-generating equipment, the first frame subassembly further including a plurality of horizontal frame members and a plurality of vertical frame members provided at one end of the heat-generating equipment and configured to define the first opening on a first side of the first frame subassembly, the second opening provided on a second side of the first frame subassembly, the second side being perpendicular to the first side, and the third opening provided on a top side of the first frame subassembly;

a second frame subassembly including a fourth opening, a fifth opening, and a sixth opening, the fourth opening being configured to provide access to another access space, the fifth opening being configured to provide access to cooling equipment and to receive a blanking panel, and the sixth opening being configured to pass hot air from the heat-generating equipment, the second frame subassembly further including a plurality of horizontal frame members and a plurality of vertical frame members provided at an opposite end of the heat-generating equipment and configured to define the fourth opening on a first side of the second frame subassembly that is parallel to the first side of the first frame subassembly, the fifth opening provided on a second side of the second frame subassembly that is parallel to the second side of the first frame subassembly, the second side being perpendicular to the first side, and the sixth opening provided on a top side of the second frame subassembly; and a third frame subassembly configured to connect the first frame subassembly and the second frame subassembly, the third frame subassembly being sized to accommodate a desired number of heat-generating equipment and to receive the hot air from the heat-generating equipment, wherein the second opening of the first frame subassembly and the fifth opening of the second frame subassembly are configured to receive cooling equipment.

10. The hot air containment system of claim 9, wherein each of the third opening of the first frame subassembly and the sixth opening of the second frame subassembly are configured to allow hot air to pass from top air exhaust heat-generating equipment.

11. The hot air containment system of claim 9, wherein the cooling equipment includes at least one in-row cooling unit.

12. The hot air containment system of claim 9, wherein the first opening of the first frame subassembly and the fourth opening of the second frame subassembly each includes an access door or removable panel.

* * * * *